US 6,639,802 B1

(12) United States Patent
Dong et al.

(10) Patent No.: US 6,639,802 B1
(45) Date of Patent: Oct. 28, 2003

(54) HEAT SINK WITH INTERLOCKED FINS

(75) Inventors: Shun Chi Dong, Austin, TX (US); Chung Yuan Huang, Austin, TX (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/288,751

(22) Filed: Nov. 5, 2002

(51) Int. Cl.⁷ .................................................. H05K 7/20
(52) U.S. Cl. ........................ 361/709; 361/704; 361/710; 257/722; 165/80.3; 165/185
(58) Field of Search ................................ 361/704, 709, 361/710; 174/16.3; 165/80.3, 185; 257/722

(56) References Cited

U.S. PATENT DOCUMENTS

| | | | | |
|---|---|---|---|---|
| 5,038,858 A | * | 8/1991 | Jordan et al. | 165/185 |
| 5,558,155 A | * | 9/1996 | Ito | 165/80.3 |
| 6,104,609 A | * | 8/2000 | Chen | 361/695 |
| 6,199,627 B1 | * | 3/2001 | Wang | 165/185 |
| 6,269,003 B1 | * | 7/2001 | Wen-Chen | 361/704 |
| 6,336,498 B1 | * | 1/2002 | Wei | 165/80.3 |

* cited by examiner

Primary Examiner—Boris Chervinsky
(74) Attorney, Agent, or Firm—Wei Te Chung

(57) ABSTRACT

A heat sink includes a base plate (30), and a plurality of fins (10) mounted on the base plate. Each fin includes a main body (12), and two upper locking members (14). Two retaining holes (22) are defined in the main body. Each locking member includes a horizontal part (16), and a vertical part (18). A slot (15) is defined in the horizontal part. A key (20) is formed in the vertical part. In assembly, a second fin is moved relative to a first fin until the locking members of the second fin are received in the corresponding slots of the first fin, and the keys of the second fin snappingly engage in the corresponding retaining holes of the main body of the first fin. Thus, the two fins are interlocked together. The other fins are then sequentially interlocked with the second fin onward, in similar fashion.

14 Claims, 4 Drawing Sheets

HEAT SINK WITH INTERLOCKED FINS

BACKGROUND OF THE INVENTION

1. Field of the Invention

The present invention relates to a heat sink for removing heat from devices such as electronic components mounted on computer circuit boards, and particularly to a heat sink configured by a plurality of interlocked fins so as to smooth production as well as reduce cost.

2. Description of the Related Art

With the continuing development of electronics technology, new electronic components can perform more and more functions. Heat generated by modern electronic components has increased commensurately. Measures must be taken to efficiently remove the heat from the electronic component. Typically, a heat sink having great heat conductivity is mounted on the electronic component to remove heat therefrom.

A conventional heat sink comprises a base plate in thermal contact with the electronic component, and a plurality of fins mounted on the base plate. The fins each have a L-shaped profile. When the heat sink is subjected to accidental force, the fins are liable to be crushed together. To overcome this problem, heat sinks having interlocking C-shaped fins have been devised. Examples of such heat sinks are found in China Patents No. 00209935.7 and No. 01200689.0. In this kind of heat sink, each fin has concave sections in top and bottom ends thereof, the concave sections interlocked with an adjacent fin. This structure can prevent accidental deformation of the heat sink to a certain extent.

However, in assembly of the fins, the top and bottom ends of each fin must be deformed somewhat so that the concave sections of the fin can engage with the concave sections of an adjacent fin. This can result in distortion and unevenness of the top and bottom ends of the fins, which in turn can adversely affect jointing between the fins and the base plate. In addition, the deformation required for each fin in assembly makes this process excessively time consuming. Manufacturing costs are commensurately high, and this retards the efficiency of mass production facilities.

Thus, a heat sink which overcomes the above-mentioned problems is desired.

BRIEF SUMMARY OF THE INVENTION

Accordingly, an object of the present invention is to provide a heat sink having fins that are easily and securely interlocked.

To achieve the above object, a heat sink in accordance with a preferred embodiment of the present invention comprises a base plate and a plurality of fins mounted on the base plate. Each fin comprises a main body and two upper locking members. Two retaining holes are defined in the main body opposite the locking members respectively. Each locking member comprises a horizontal part, and a vertical part depending from the horizontal part. A slot is defined in the horizontal part. A key is formed in the vertical part. In assembly, a second fin is placed parallel to and against a face of a first fin, such that a side edge of the second fin is offset from a corresponding side edge of the first fin. Then the second fin is moved relative to the first fin until the locking members of the second fin are received in the corresponding slots of the first fin, and the keys of the second fin snappingly engage in the corresponding retaining holes of the main body of the first fin. Thus, the first and second fins are interlocked together. The other fins are then sequentially interlocked with the second fin onward, in similar fashion. Finally, the set of interlocked fins is mounted on the base plate.

Other objects, advantages and novel features of the present invention will be drawn from the following detailed description of a preferred embodiment of the present invention with the attached drawings, in which:

DETAILED DESCRIPTION OF THE INVENTION

Figure 1:
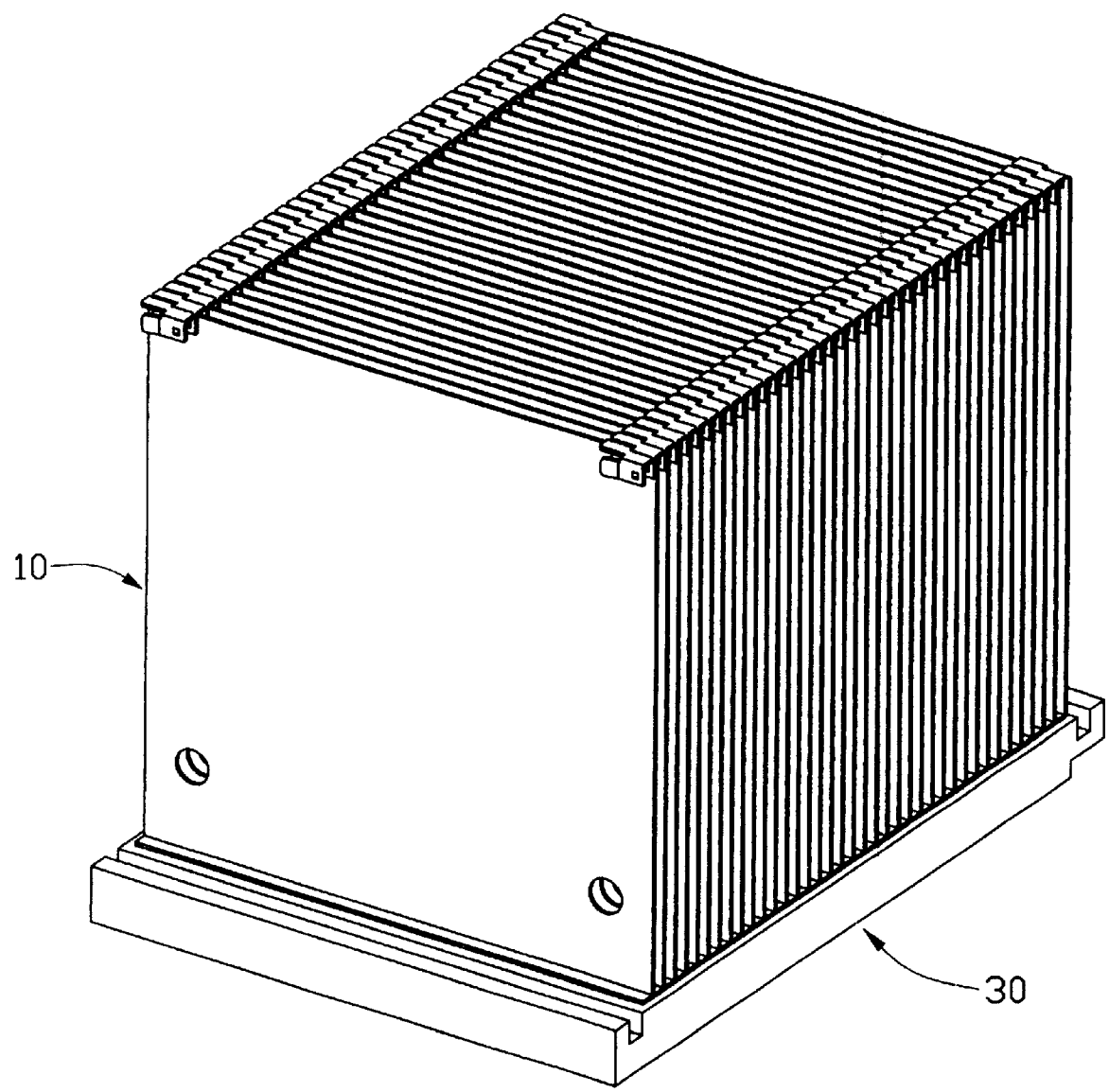
FIG. 1 is an isometric view of a heat sink in accordance with a preferred embodiment of the present invention.

Referring to FIG. 1, a heat sink in accordance with a preferred embodiment of the present invention comprises a base plate 30, and a plurality of fins 10 mounted the base plate 30.

Figure 2:
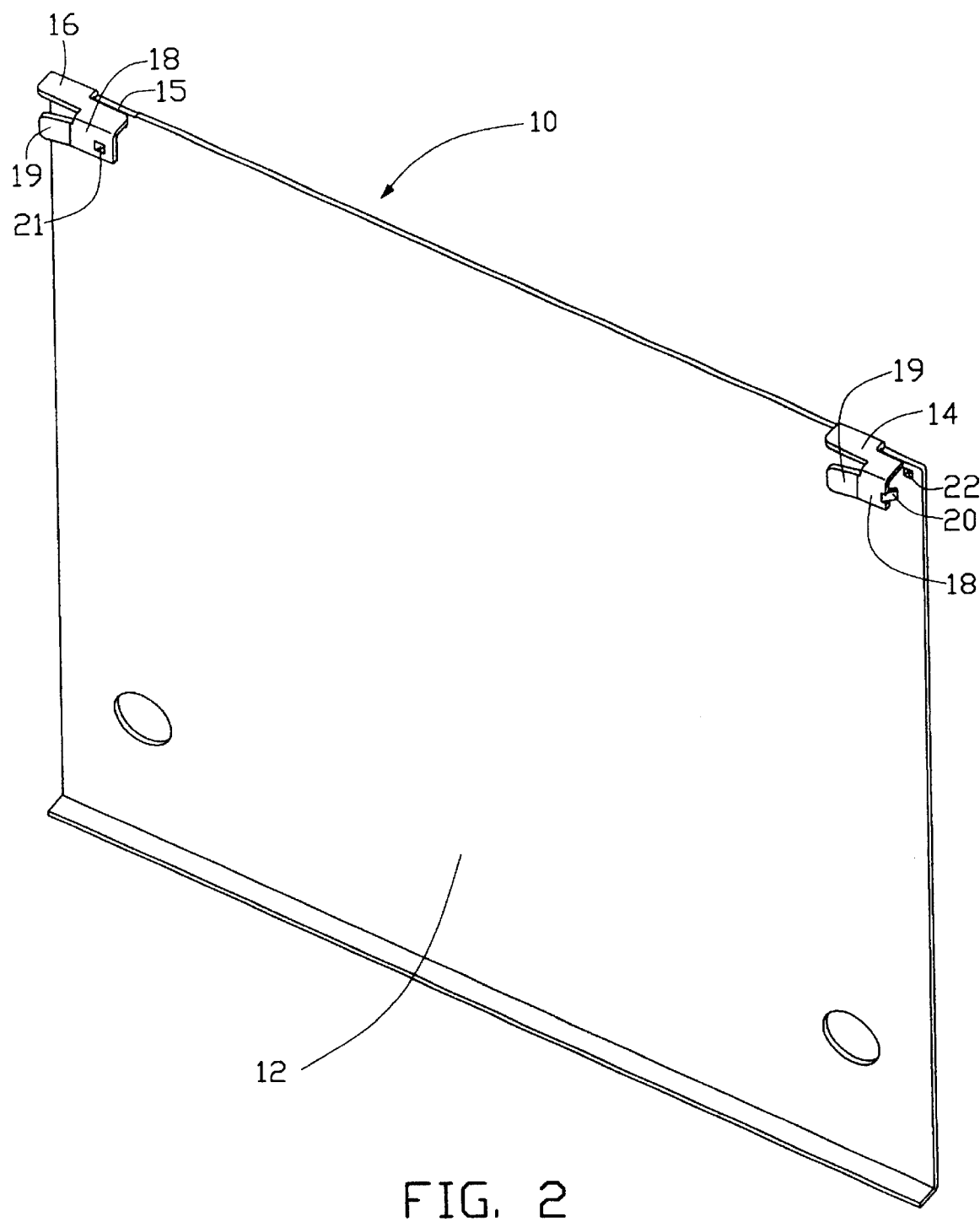
FIG. 2 is an isometric view of one fin of the heat sink of FIG. 1.

Referring to FIG. 2, each fin 10 comprises a main body 12, and two locking/spacing members 14 extending in a same direction from opposite ends respectively of a top edge of the main body 12. Two retaining holes 22 are respectively defined in two opposite corners of a top portion of the main body 12, adjacent the corresponding locking members 14.

Each locking member 14 comprises a horizontal part 16, and a vertical part 18 perpendicularly depending from a distal edge of the horizontal part 16. A slot 15 is defined in one side of the horizontal part 16 at the main body 12. A length of the slot 15 is substantially the same as a corresponding length of the perpendicular portion 18. A retaining portion (not labeled) is provided in the vertical part 18. The retaining portion comprises a square hole 21 defined in the perpendicular portion 18, and a retaining key 20 extending slantwisedly toward the main body 12 from one side edge of the vertical part 18 that borders the square hole 21. The square hole 21 is generally opposite the corresponding retaining hole 22 of the main body 12. A guider 19 extends slantwisedly away from an edge of the vertical part 18 that is distal from the key 20.

Figure 3:
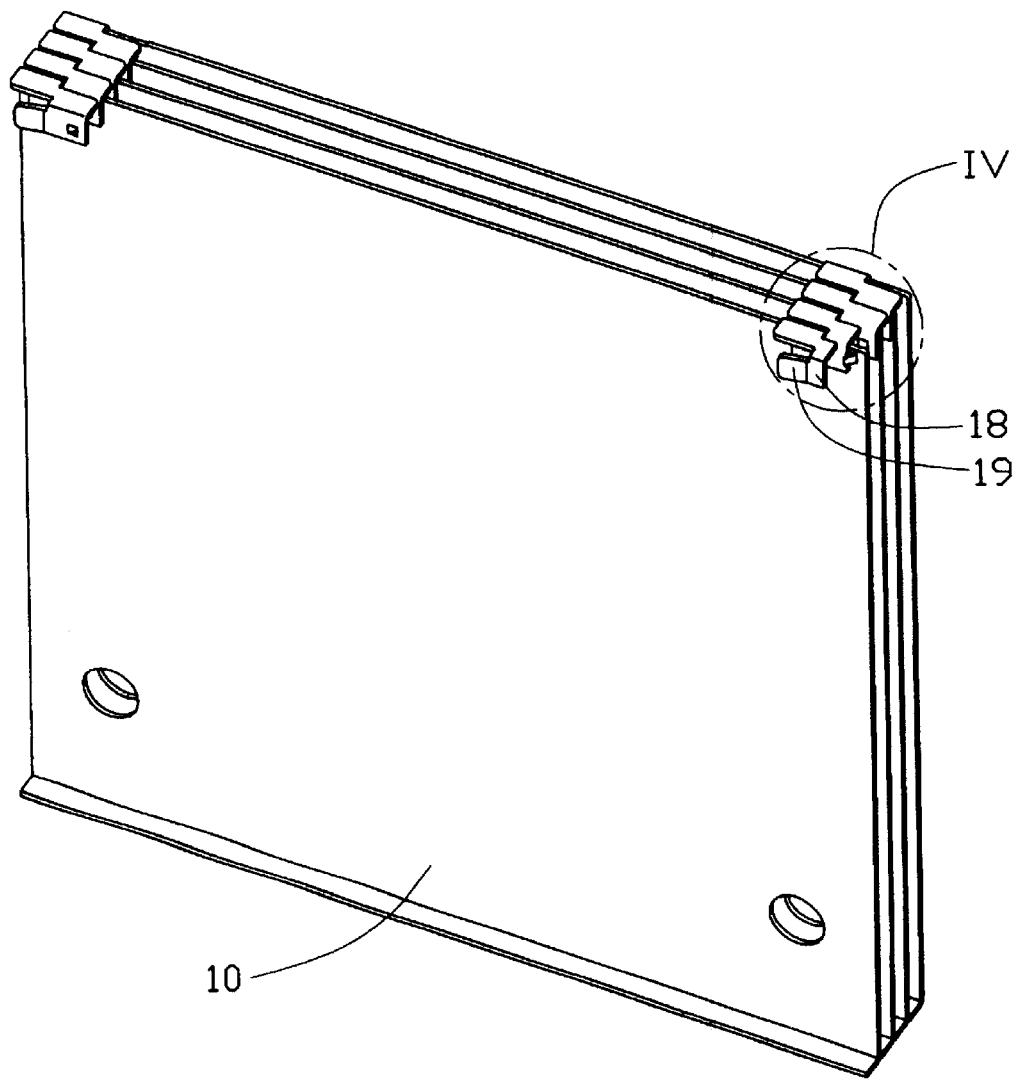
FIG. 3 is an isometric view of four fins of the heat sink of FIG. 1 assembled together.
Figure 4:
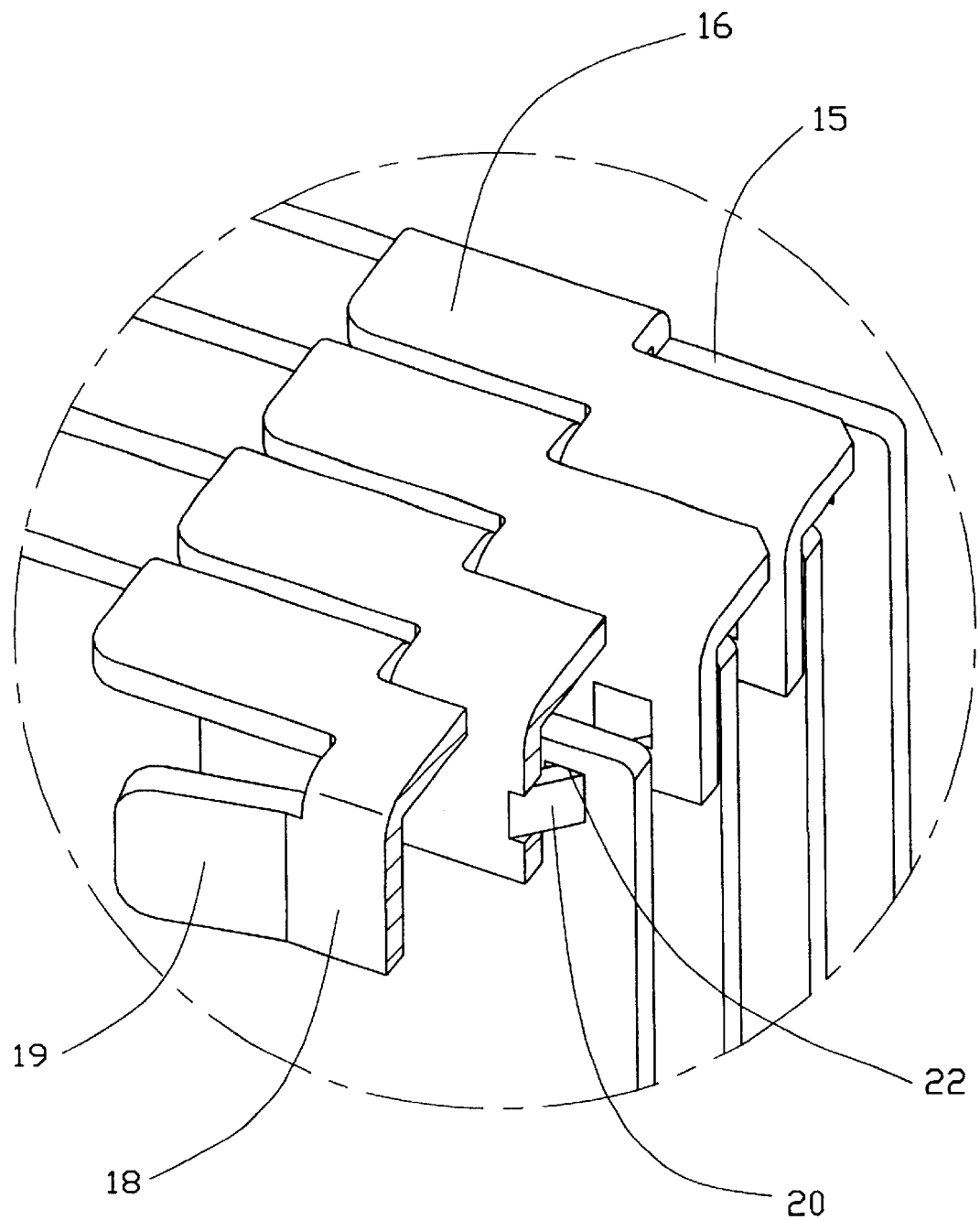
FIG. 4 is an enlarged view of a circled portion IV of FIG. 3.

Referring to FIGS. 3 and 4, in assembly, a first fin 10 is held in a vertical orientation, and a second fin 10 is placed parallel to and against a rear face of the first fin 10. In such position, the second fin 10 is offset from the first fin 10 such that the guiders 19 of the second fin 10 are located substantially rightwardly of and near the corresponding slots 15 of the first fin 10. Then the second fin 10 is moved left until a junction of the horizontal part 16 and the vertical part 18 of each locking member 14 of the second fin 10 is fully received in the corresponding slot 15 of the first fin 10. At the same time, the keys 20 of the second fin 10 snappingly engage in the corresponding retaining holes 22 of the first fin 10. The first and second fins 10 are thus interlocked together. Other fins 10 are then sequentially interlocked with the second fin 10 onward, in similar fashion. Finally, the set of interlocked fins 10 is mounted on the base plate 30 by conventional means.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink for dissipating heat from an electronic component of a circuit board, the heat sink comprising:

a base plate adapted for contacting the electronic component; and a plurality of fins mounted on the base plate, each fin comprising a main body and at least one locking member providing a locking portion, at least one retaining portion being defined in the main body, wherein one fin is laterally movable along another fin adjacent said one fin to allow the locking portion in said one fin to engage with the retaining portion in said another fin, thereby interlocking the fins together.

2. The heat sink as claimed in claim 1, wherein the at least one locking member comprising a horizontal part and a vertical part on which the locking portion is formed.

3. The heat sink as claimed in claim 2, wherein a guider extending from the vertical part for guiding the fin in assembly.

4. The heat sink as claimed in claim 2, wherein a slot is defined in the horizontal part of the at least one locking member of each of the fins for receiving the at least one locking member of an adjacent fin.

5. The heat sink as claimed in claim 2, wherein the at least one locking portion of each of the fins defines a hole in the vertical part thereof, and the locking portion is formed at the hole.

6. A method for assembling a heat sink having interlocked fins, the method comprising the steps of:

a) providing a base plate;

b) providing a plurality of fins, interlocking means arranged between the fins;

c) placing a first one of the fins adjacent a second one of the fins;

d) moving laterally either or both of the first and second fins until the first fin is interlocked with the second fin;

e) assembling all other of the fins to the second and/or first fins in like manner to the procedure described in steps c) and d); and f) mounting the assembled fins to the base plate.

7. A heat sink, comprising:

a base made from a heat conductive material and defining a top surface;

a plurality of fins extending from the top surface of the base; and interlocking means arranged between the fins such that each fin is interlocked with adjacent fins from a lateral direction which is parallel along an edge of the fin.

8. The heat sink as claimed in claim 7, wherein the interlocking means comprises at least one locking portion arranged in each fin and at least one retaining portion arranged in a corresponding adjacent fin.

9. The heat sink as claimed in claim 8, wherein each fin comprises a main body and at least one locking member, and comprises a horizontal part extending from the main body and a vertical part on which the locking portion is formed.

10. The heat sink as claimed in claim 9, wherein a guider extending from the vertical part for guiding the fin in assembly.

11. The heat sink as claimed in claim 9, wherein a slot is defined in the horizontal part of the at least one locking member of each of the fins for receiving the at least one locking member of an adjacent fin.

12. A heat sink comprising:

a base plate defining a lengthwise direction thereof;

a plurality of fins mounted on the base plate in a parallel relation along said lengthwise direction, each of said fins extending in a transverse direction perpendicular to said lengthwise direction;

said fins assembled with one another in said transverse direction, each of said fins including a planar main body with a spacing member integrally extending therefrom in a lengthwise direction, said spacing member including a horizontal portion extending from the main body partially with a slit therebetween, and a vertical portion extending from said horizontal portion; wherein when assembled, a junction portion of said vertical portion and said horizontal portion of one fin is received in the slit of an adjacent fin, and said vertical portion of said one fin abuts against the main body of said adjacent fin opposite to the main body of said one fin, so as to retainably spatially assemble said one fin and said adjacent fin together.

13. The heat sink as claimed in claim 12, further including means for interlocking the main body of said one fin and the spacing member of said adjacent fin without relative movement in said transverse direction.

14. The heat sink as claimed in claim 13, wherein said means includes a resilient tang formed on one of said main body and said spacing member, and a locking opening formed in the other of said main body and said spacing member.

* * * * *